United States Patent [19]

Fox

[11] Patent Number: 4,739,268
[45] Date of Patent: Apr. 19, 1988

[54] RF PULSE CONTROL SYSTEM FOR A MAGNETIC RESONANCE IMAGING TRANSMITTER

[75] Inventor: Timothy R. Fox, Chicago, Ill.

[73] Assignee: Kabushiki Kaisha Toshiba, Kawasaki, Japan

[21] Appl. No.: 5,844

[22] Filed: Jan. 21, 1987

[51] Int. Cl.[4] ............................................. G01R 33/20
[52] U.S. Cl. .................................... 324/314; 324/309
[58] Field of Search ................ 330/149; 324/307, 309, 324/322, 311, 313, 314; 455/126

[56] References Cited

U.S. PATENT DOCUMENTS 4,331,928  5/1982  Heidt ................................. 330/149
4,563,775  1/1986  Yokosuka ........................... 455/126
4,665,364  5/1987  Hanawa .............................. 324/309

Primary Examiner—Michael J. Tokar
Attorney, Agent, or Firm—Finnegan, Henderson, Farabow, Garrett & Dunner

[57] ABSTRACT

A pulse control system for a magnetic resonance imaging transmitter has circuitry for detecting the peak value of the RF current in the transmitter coil for a given RF pulse; circuitry for comparing the detected peak value of the RF current with a desired reference peak value for the RF pulse, for determining the difference between the detected and the desired peak values for the RF pulse, and for determining a gain adjustment factor for the transmitter amplifier for the transmitter necessary to produce the desired peak value of the RF current in the transmitter coil; and circuitry for adjusting the gain of the transmitter amplifier in response to the gain adjustment factor to produce the desired peak value of the RF current for the RF pulse.

10 Claims, 2 Drawing Sheets

RF PULSE CONTROL SYSTEM FOR A MAGNETIC RESONANCE IMAGING TRANSMITTER

BACKGROUND OF THE INVENTION

1. Field Of The Invention

This invention relates generally to the field of magnetic resonance imaging systems and, more specifically, to the transmitter in a magnetic resonance imaging system which transmitter contains a pulse control system to aid in the production of a radio-frequency current pulse in the transmitter coil with a desired magnitude to improve imaging results.

2. Description Of Related Art

Magnetic resonance imaging ("MRI"), also known as nuclear magnetic resonance ("NMR") imaging, has become a valuable tool as a safe, non-invasive means for obtaining information in the form of images of objects under examination. For example, MRI can be used as a medical diagnostic tool by providing images of selected portions of the human body without the use of X-ray photography.

In such an MRI system, a transmitter system is utilized to generate a high-frequency magnetic field within the imaging volume of the object under examination in order to manipulate the spins of the relevant nuclei within the imaging volume as is well known in the art. A typical MRI transmitter system shown in a basic configuration is illustrated in FIG. 1. MRI transmitter 10 includes radio-frequency ("RF") pulse generator 11, transmitter amplifier 12, coupling network 13, and transmitter coil 14. RF pulse generator 11 produces a modulated carrier output on its output 15 of desired shape and magnitude. Typically, the RF pulse produced is a voltage waveform having a repeated rectangular pulse shape or a sinc pulse shape of desired time duration and magnitude. The RF pulse is produced by a modulator which has as inputs an RF carrier and a desired modulating input. The RF pulses are fed into input 16 of linear transmitter amplifier 12 and amplified from a typical 0.1-1.0 watt signal to pulses having a power in the range of 100 to 10,000 watts on the amplifier's output 17. The amplifier should provide a linear response over the operating frequency range of the transmitter.

Coupling network 13 receives the amplified RF pulse from amplifier 12 and produces the desired RF current in transmitter coil 14. That current, in turn, generates the desired high-frequency magnetic field inside the transmitter coil. Coupling network 13 usually consists of a tuned transformer network which acts to resonate transmitter coil 14 and to provide a proper load impedance for the output of transmitter amplifier 12. Typical operating frequencies range from less than 1 megahertz to 100 megahertz and more typically range between 5 and 80 megahertz. The desired RF current is dependent upon the specific MRI system, the material being examined, the type of information sought from the scanning and the like and is readily determined by a person of ordinary skill in the art.

For proper operation of the imager of the MRI system, the generated high-frequency magnetic field must be a pulse with a definite time-dependence (that is, shape) and definite absolute value (that is, magnitude) to manipulate properly the spins of the relevant nuclei within the imaging volume. For example, a pulse of specified duration and field strength, sinusoidally oscillating at the Larmor resonance frequency for the nuclear spin, can be applied to the volume in order to rotate the net nuclear spin magnetization of the relevant nuclei of the patient or object under examination in a desired manner for proper imaging.

In practice, the time duration of the high-frequency magnetic field pulse can be easily controlled. By using a transmitter amplifier, such as amplifier 12 in FIG. 1, the shape of the pulse can also be controlled. The magnitude of the actual high-frequency magnetic field within the imaging volume will depend mainly on the RF current through the transmitter coil, such as coil 14 of transmitter 10 in FIG. 1. The relationship between this RF current and the RF pulse input to the transmitter amplifier is sensitive, however, to the details of the coupling between transmitter coil 14 and the patient or object under examination since the latter will affect both the reactance ("detuning") and resistance ("loading") of the transmitter coil at the operating frequency. The current through coil 14 produced from the RF pulses out of transmitter amplifier 12 is, therefore, a function of the coil impedance which is affected by the above discussed reactance and resistance. Thus, the current will vary with a change in position, size, conductivity, etc. of the patient or object under examination or motion of the patient within the imaging volume.

Ideally, more accurate control of the high-frequency magnetic field would be achieved by detection of the actual magnetic field value in the imaging volume during scanning of an object under examination and by adjusting the RF pulses to produce the desired magnetic field value. However, that process is not practical since the most appropriate location for monitoring that field is already occupied by the object under examination during scanning. A more practical method of attempting to obtain a consistent and appropriate magnitude of the high-frequency magnetic field is to produce an RF pulse in the MRI transmitter with an object in the imaging volume, receive the resulting NMR signal in the MRI system's receiver, and then maximize the received signal by adjusting the gain of the transmitter amplifier in the MRI transmitter. This method, however, is a time consuming one for optimizing the RF pulses and cannot be done while imaging, that is, during scanning. Furthermore, as discussed above, coupling may change the current in the transmitter coil due to the change of the object under examination or due to movement of that object during examination.

To obtain a consistent, desired magnitude of the high-frequency magnetic field from one imaging scan to another, it would be beneficial to adjust the transmitter amplifier gain to obtain a consistent, desired magnitude of the coil current from scan to scan. This would be much more convenient than adjusting the actual magnetic field value and would be much faster then the method described above. In principle, the RF current through transmitter coil 14 could be stabilized by applying negative feedback to transmitter amplifier 12 from a sample of the current through the transmitter coil. In practice, however, the sine-wave carrier is a high-frequency carrier (typically 5 to 80 megahertz), and transmitter coil 14 is located far from transmitter amplifier 12 (usually more than 10 meters away). Thus, there would be, in practice, a phase shift caused by the propagation delay through the transmitter output and feedback sample cables. That unwanted phase shift makes direct feedback at the carrier frequency extremely difficult and impractical. For example, the use of 20 meters of coaxial cable having a velocity factor of 0.66 will give 180° of phase shift at approximately 5 megahertz operating frequency. Furthermore, attempts at stabilizing the RF current out of the transmitter amplifier are not sufficient since the ratio between the amplifier's output current and the coil current is affected by the detuning and loading caused by the object being examined as discussed above.

From the foregoing considerations, it should be apparent that there is a need for an improved MRI transmitter system in which an RF current pulse in the transmitter coil can be controlled to maintain a desired magnitude during scanning of an object under examination.

It is, thus, intended that the invention provide a pulse control system for an MRI transmitter in which there is improved performance.

Another intent is that the invention provide a pulse control system to produce an RF current pulse in the transmitter coil with a desired magnitude during scanning.

Still another intent is that the invention provide a pulse control system for an MRI transmitter to compensate for tuning and loading changes in the transmitter coil caused by variations in size, position, and conductivity of the object under examination.

Yet another intent is that the invention provide a pulse control system for an MRI transmitter to correct the magnitude of the RF current in the transmitter coil to a desired magnitude which correction avoids the problems of phase shift at carrier frequency.

Other intentions and features of the invention will further become apparent with reference to the accompanying drawings and the detailed description of the invention or may be learned by practice of the invention.

SUMMARY OF THE INVENTION

To achieve the foregoing intentions and in accordance with the purpose of the invention as embodied and broadly described herein a pulse control system for an MRI transmitter is provided. The transmitter has a transmitting coil, an RF pulse generator for generating RF pulses and a transmitter amplifier for amplifying the RF pulses and for providing the RF pulses to the transmitter coil to produce RF currents in the transmitter coil. The RF current in the coil has a desired peak value. The pulse control system comprises means for detecting the peak value of the RF current in the transmitter coil for an RF pulse; and means for comparing the detected peak value of the RF current with a desired reference peak value for the RF pulse, for determining the difference between the detected and desired peak values for the RF pulse, and for determining a gain adjustment factor for the transmitter amplifier necessary to produce the desired peak value of the RF current in the transmitter coil.

The pulse control system also comprises means for adjusting the gain of the transmitter amplifier in response to the gain adjustment factor for the RF pulse to produce the desired peak value of the RF current for the RF pulse.

In a preferred embodiment, the peak detecting means includes current sensing means, such as a current sensing transformer, operatively coupled to the transmitter coil, for sensing the RF current in the transmitter coil and for producing an RF current proportional to the sensed RF current and a peak detector, operatively coupled to the current sensing means, for receiving the RF current from the current sensing means and for producing a peak voltage proportional to the peak value of the received RF current.

The comparing means in a preferred embodiment of the pulse control system includes a magnitude comparator and a latch, wherein the magnitude comparator receives the peak voltage from the peak detector and compares it with a reference peak voltage representative of the desired RF pulse to produce the gain adjustment factor and wherein the gain adjustment factor is stored in the latch. Furthermore, the means for adjusting the gain of the transmitter amplifier is, in a preferred embodiment, an attenuator to vary the gain between the output of the RF pulse control and the input to the transmitter amplifier in response to the gain adjustment factor for the RF pulse.

BRIEF DESCRIPTION OF THE DRAWINGS

The accompanying drawings, which are incorporated in and constitute part of the specification, illustrate an embodiment of the invention and, together with the description, serve to explain the principles of the invention.

Of the drawings.

Reference will now be made in detail to the present preferred embodiment of the invention, an example of which is illustrated in the accompanying drawings.

DESCRIPTION OF THE PREFERRED EMBODIMENT

Figure 1:
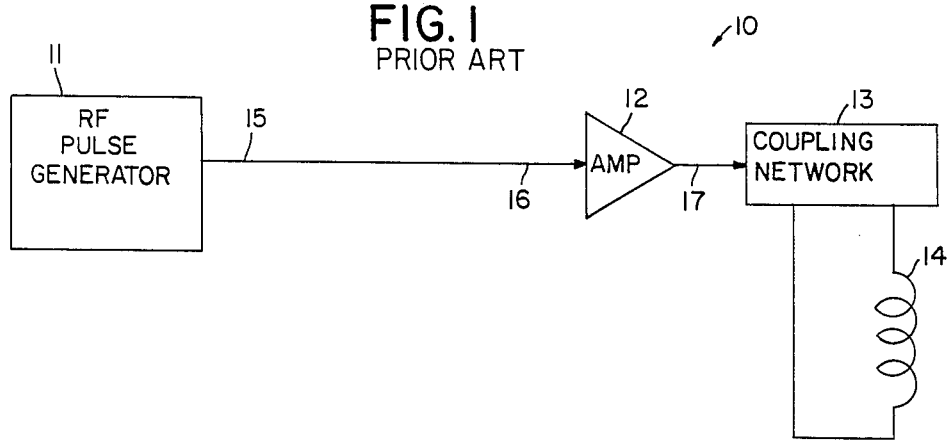
FIG. 1 is a block diagram of a conventional MRI transmitter.
Figure 2:
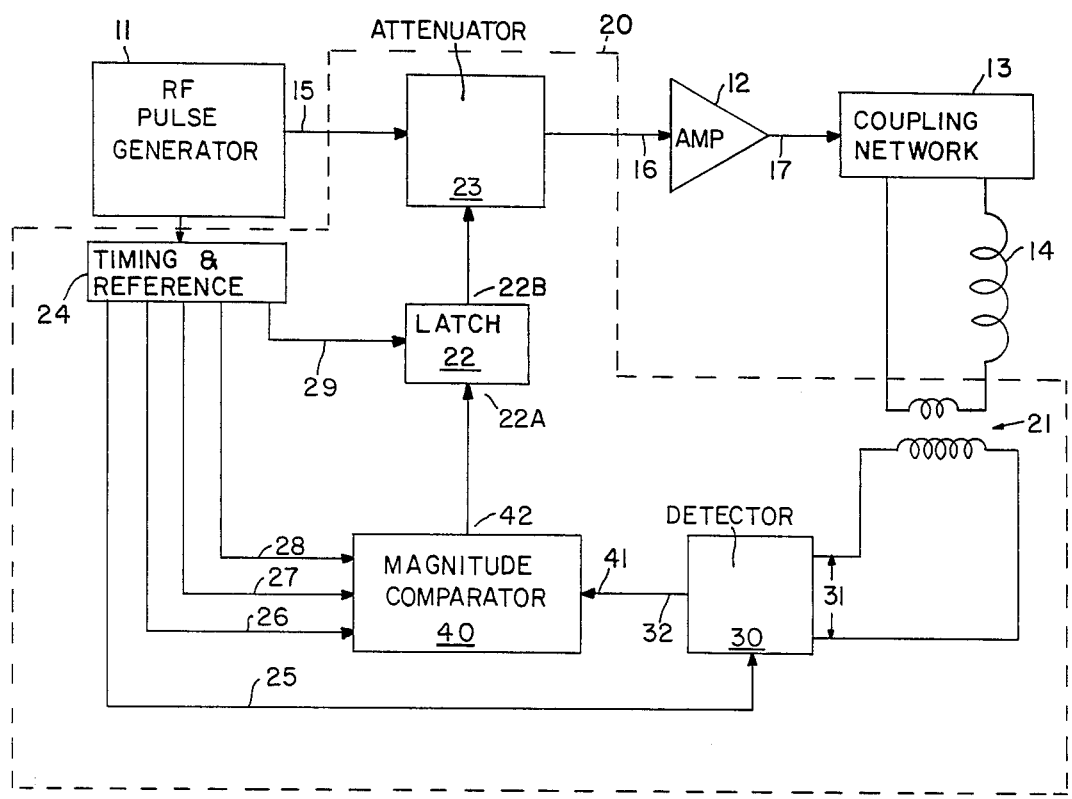
FIG. 2 is a block diagram of a pulse control system for an MRI transmitter according to a preferred embodiment of the invention.

Referring again to the drawings, wherein like reference characters designate like or corresponding parts throughout the several drawings, there is shown in FIG. 2 pulse control system 20 for an MRI transmitter, such as transmitter 10 of FIG. 1. Pulse control system 20 includes means for detecting the peak value of the RF current in transmitter coil 14 for a specific RF pulse produced from RF pulse generator 11. The peak detecting means includes current sensing means, such as current sensing transformer 21, operatively coupled to transmitter coil 14, for sensing the RF current in the transmitter coil and for producing an RF current proportional to the sensed RF current in the transmitter coil. Other current sensing means could be used, such as the detection of voltage across a resistor of known value which is in series with transmitter coil 14.

The peak detecting means, as shown in FIG. 2, also includes peak detector 30 having input 31 operatively coupled to current sensing means 21 and an output 32. Peak detector 30 receives the sensed RF current from the current sensing means and produces a voltage proportional to the peak value of the received RF current. One specific embodiment of peak detector 30 is illustrated in FIG. 3.

Since the high-frequency carrier for the RF pulse produced in RF pulse generator 11 is symmetric about zero voltage, the peak detector can detect either the maximum absolute value, the maximum positive value, or the maximum negative value of the input to the detector. Furthermore, peak detector 30 can be built from any number of conventional designs. In FIG. 3, for example, peak detector 30 is built in the form of a simple diode detector to serve the purpose of a peak detecting envelope detector.

Figure 3:
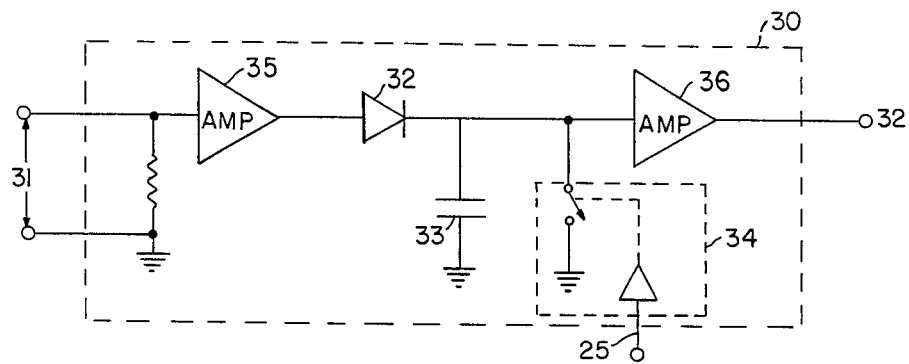
FIG. 3 is a schematic showing the details of the peak detector of FIG. 2 according to one preferred embodiment of the invention.

Detector 30, as shown in FIG. 3, receives the sensed RF current from current sensing transformer 21 at the detector's input 31. That input can be amplified by a conventional amplifier 35 if necessary and is placed on the anode of diode 32. That voltage represents the RF current received by the current sensing transformer. Capacitor 33, operatively coupled to the cathode of diode 32, acts as a holding capacitor for holding the maximum value of the voltage sensed at input 31 of detector 30. Diode 32 will charge holding capacitor 33 whenever the voltage into the diode is more positive than the voltage across the capacitor. Thus, the capacitor will charge up to a voltage equal to the peak positive input voltage less a small voltage drop across the conducting diode. Although the simple diode detector is not truly a linear device and although the voltage drop across the conducting diode affects the peak detected voltage value, the simple diode detector can still be used effectively. Any such non-linearity can be compensated for during programming of the magnitude comparator which programming is discussed below.

The peak voltage held across capacitor 33 will remain there so long as the input voltage does not again rise above the previous peak voltage. Of course, there are leakage currents through the reverse-biased diode and through output buffer amplifier 36 of peak detector 30 so that the charge on the capacitor will slowly change. Thus, the output of peak detector 30 should be processed as soon as possible after the RF pulse under study has issued from generator 11.

Peak detector 30, as illustrated in FIGS. 2 and 3, also contains means for resetting the voltage output to zero after detection of the peak voltage. After the RF pulse is processed, capacitor 30 is short circuited to reset the held peak voltage value to zero. This reset allows a new peak voltage to be detected. The resetting means is designated 34 in FIG. 3 and can be a switch which is used to short circuit capacitor 33 to ground. As illustrated, the switch can be electro-mechanical and operated by, for example, a solenoid, or it can be an FET or some other switching means operative upon receipt of a "reset" signal on reset signal line 25. The "reset" signal is produced by timing and reference circuitry 24 as discussed below.

Figure 4:
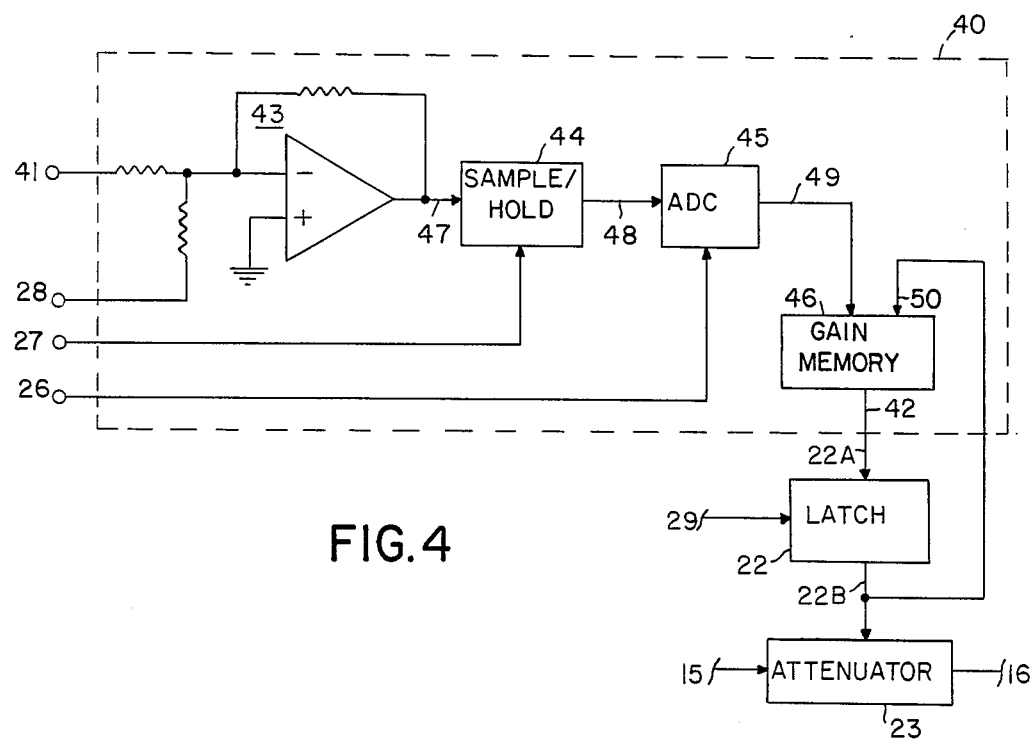
FIG. 4 is a block diagram showing the details of the magnitude comparator of FIG. 2 according to one preferred embodiment of the invention.

Pulse control system 20 of FIG. 2 also includes means for comparing the detected peak value of the RF current which is detected by peak detector 30 with a desired reference peak value for the RF pulse being analyzed. The comparing means determines the difference between the detected and desired peak values for that RF pulse and determines a gain adjustment factor for transmitter amplifier 12 necessary to produce the desired peak value of the RF current in transmitter coil 14. As illustrated in FIG. 2, the comparing means of pulse control system 20 includes magnitude comparator 40 and latch 22. The details of one embodiment of magnitude comparator 40 are shown in FIG. 4.

Magnitude comparator 40 receives on its input 41 the peak voltage from output 32 of peak detector 30 and receives on reference voltage input line 28 a reference peak voltage representative of the desired RF pulse. That reference peak voltage is generated from timing and reference circuitry 24 which, in addition to producing a reference peak voltage for each RF pulse being processed, produces the necessary timing commands for the sequential operation of pulse control system 20 as discussed in more detail below. Magnitude comparator 40 makes a comparison between the desired reference peak value for the RF pulse being processed and the detected peak value for that RF pulse and produces a gain adjustment factor at output 42 of the magnitude comparator.

The gain adjustment factor is input in a conventional manner into latch 22 at its input 22A. The gain adjustment factor is stored in latch 22 after a "set gain" signal is received on set gain control line 29 from timing and reference circuitry 24. At that time the gain adjustment factor is provided to attenuator 23. This latching operation keeps the gain adjustment factor constant between RF pulses that are analyzed.

Attenuator 23 can be a programmable attenuator to allow external electronic control of the gain of transmitter amplifier 12. The gain adjustment factor is the new setting for attenuator 23 which attenuator modifies the RF pulse signal output on output 15 of RF pulse generator 11. The properly attenuated RF pulse is placed into input 16 of transmitter amplifier 12. A variable gain amplifier could be used in place of attenuator 23 if desired. In such situation the gain adjustment factor output from latch 22 would be the new gain setting for the variable gain amplifier.

A person of ordinary skill in the art, upon reading this disclosure, can readily design a variety of devices to satisfy the requirements of the magnitude comparator and latch. One specific embodiment of magnitude comparator 40 of FIG. 2 is shown in FIG. 4 which illustrates an analog version of a magnitude comparator. Of course, the desired function of the magnitude comparator could be implemented with the use of a microprocessor and appropriate software.

In the analog magnitude comparator 40 of FIG. 4, analog subtractor 43 receives the reference peak voltage (a negative value in the specific embodiment shown in FIG. 4) from reference voltage input line 28 and the peak voltage (a positive value in the FIG. 4 embodiment) from peak detector 30 on input 41 and produces an error voltage on the subtractor's output 47 in a conventional manner. The error voltage for the RF pulse being processed is the difference between the reference peak voltage and the detected peak voltage for that RF pulse. At output 47 of subtractor 43 is sample/hold circuit 44 which samples and holds the error voltage upon receipt of a "compare" signal on compare control line 27. Analog-to-digital converter ("ADC") 45 receives the sampled and held error voltage output on output 48 of sample/hold circuit 44 and digitizes that voltage which digitized voltage is produced on output 49 of ADC 45 upon receipt of a "convert" command on convert control line 26. The "command" and "convert" signals are produced in timing and reference circuitry 24.

The digitized error voltage and the previous gain adjustment factor for the previous RF pulse (that is, the previous attenuator setting for attenuator 23) from latch output 22B are used to formulate the address for gain memory 46. Stored in the gain memory are data necessary to provide the new gain adjustment factor based on the digitized error voltage and the previous gain adjustment factor. The data are obtained during calibration of the MRI system. The data placed into gain memory 46 during programming can also compensate for the nonlinearity in the peak detector of the type illustrated in FIG. 3 as discussed above. Furthermore, the gain memory can be programmed to keep the gain adjustment factor unchanged when the measured current is sufficiently close to the specified and desired current, that is, when the error voltage on subtractor output 47 is close to zero.

The reference peak voltage for each RF pulse being analyzed is obtained during calibration of the MRI system. For example, the above discussed conventional optimization process can be used to determine the desired reference voltages. An RF pulse of known duration and magnitude is produced in the MRI transmitter with an object in the imaging volume, and the gain of the transmitter amplifier is adjusted to maximize the received NMR signal resulting from the RF pulse. Next, while the transmitter amplifier gain is held constant, the voltage on reference voltage input line 28 is adjusted to a value equal to the detected peak value for that RF pulse, thus making the output of subtractor 43 (that is, the error voltage) zero.

In operation, pulse control system 20 measures the current flowing through the leads to transmitter coil 14 during a test pulse produced out of RF pulse generator 11. In the specific embodiment illustrated, the current is sensed by a suitable current transformer which produces an output current in its secondary which is proportional to the current in its primary which is a portion of transmitter coil 14's leads. Peak detector 30 detects the peak value of the high-frequency current during the RF pulse being processed. Magnitude comparator 40 compares the detected peak value with a reference value for the RF pulse used for the test. Magnitude comparator 40, by determining the error voltage resulting from the comparison and by utilizing the previous gain setting of attenuator 23, produces the necessary gain adjustment factor for attenuator 23. This new setting will allow the production of an input signal into coupling network 13 which will produce the desired coil current in transmitter coil 14. The desired coil current will, in turn, generate the appropriate magnetic field and, therefore, aid in the production of better imaging. In doing so, pulse control system 20 compensates for tuning and loading changes in the transmitter coil 14 caused by variations in the object size, position, conductivity, etc., which changes will affect the actual high-frequency current flowing through the transmitter coil for a given signal input. Furthermore, the compensation provided by pulse control system 20 is available during actual scanning of a body under examination.

The timing commands required for the sequential operation of pulse control system 20 are as follows:
1. "Reset": after an RF pulse is processed, the value of voltage held in peak detector 30 is reset to zero so that a new peak voltage can be detected for a new RF pulse;
2. RF pulse generator 11 produces the RF pulse at output 15 for processing at which time the reference peak voltage is placed on reference voltage input line 28 to magnitude comparator 40;
3. "Compare": the error voltage on output 47 of subtractor 43 in magnitude comparator 40 is sampled and held for digitization by ADC 45;
4. "Convert": ADC 45 of magnitude comparator 40 digitizes the error voltage on output 48 of sample/hold circuit 44 and gain memory 46 produces the new gain adjustment factor which will be clocked into latch 22;
5. "Set gain": the new gain adjustment factor is transferred into latch 22 and attenuator 23.

As shown in FIG. 2, timing and reference circuitry 24 provides the reference voltage and above-discussed timing commands. The reference voltage and timing commands are coordinated with the operation of RF pulse generator 11 and the specific RF pulses being generated from processing. The compensation process of pulse control system 20 can be done periodically, on a random basis, or as an iterated process during normal scanning operations of the MRI system.

It will be apparent to those skilled in the art that various modifications and variations can be made in the pulse control system of the present invention without departing from the scope or spirit of the invention. Thus, it is intended that the present invention covers the modifications and variations of this invention provided they come within the scope of the appended claims and their equivalents.

What is claimed is:
1. A pulse control system for an MRI transmitter, the transmitter having a transmitting coil, an RF pulse generator for generating RF pulses, a transmitter amplifier for amplifying the RF pulses and for providing the RF pulses to the transmitter coil to produce RF currents in the transmitter coil, each RF current having a desired peak value, comprising:
    means for detecting the peak value of the RF current in the transmitter coil for an RF pulse;
    means for comparing the detected peak value of the RF current with a desired reference peak value for the RF pulse for determining the difference between the detected and desired peak values for the RF pulse, and for determining a gain adjustment factor for the transmitter amplifier necessary to produce the desired peak value of the RF current in the transmitter coil; and
    means for adjusting the gain of the transmitter amplifier in response to the gain adjustment factor for the RF pulse to produce the desired peak value of the RF current for the RF pulse.

2. The pulse control system of claim 1 wherein the peak detecting means includes current sensing means, operatively coupled to the transmitter coil, for sensing the RF current in the transmitter coil and for producing an RF current proportional to the sensed RF current and a peak detector, operatively coupled to the current sensing means, for receiving the RF current from the current sensing means and for producing a peak voltage proportional to the peak value of the received RF current.

3. The pulse control system of claim 2 wherein the current sensing means is a current sensing transformer, the primary winding of which is in series with the transmitter coil and the secondary of which is connected to the input of the peak detector.

4. The pulse control system of claim 2 wherein the peak detector is a peak-detecting envelope detector.

5. The pulse control system of claim 2 wherein the peak detector includes a diode detector having a diode for receiving a voltage representing the received RF current and a capacitor connected to an output of the diode for holding the maximum value of the voltage.

6. The pulse control system of claim 2 wherein the peak detector includes means for resetting the voltage output to zero after detection of the peak voltage.

7. The pulse control system of claim 2 in which the comparing means includes a magnitude comparator and a latch, wherein the magnitude comparator receives the peak voltage from the peak detector and compares it with a reference peak voltage representative of the desired RF pulse to produce the gain adjustment factor and wherein the gain adjustment factor is stored in the latch.

8. The pulse control system of claim 7 wherein the magnitude comparator includes a subtractor which receives the reference peak voltage and the peak voltage from the peak detector and produces an error voltage for the RF pulse based on the difference between the reference peak voltage and the detected peak voltage, a sample/hold circuit for sampling and holding the error voltage, an analog-to-digital converter for digitizing the error voltage on an output of the sample/hold circuit, and a gain memory, operatively coupled to the analog-to-digital converter, for producing the gain adjustment factor based on the digitized error voltage and the previous gain adjustment factor.

9. The pulse control system of claim 1 wherein the means for adjusting the gain of the transmitter amplifier is an attenuator to vary the gain between the output of the RF pulse control and the input to the transmitter amplifier in response to the gain adjustment factor for the RF pulse.

10. The pulse control system of claim 1 further including a timing and reference means for producing timing commands for the sequential operation of the peak detecting means, comparing means, and the gain adjusting means for each RF pulse and for producing the desired reference peak value for each of the RF pulses.

* * * * *